(12) United States Patent
Liu et al.

(10) Patent No.: US 8,969,922 B2
(45) Date of Patent: Mar. 3, 2015

(54) FIELD EFFECT TRANSISTORS AND METHOD OF FORMING THE SAME

(75) Inventors: Chia-Chu Liu, Shin-Chu (TW); Kuei Shun Chen, Hsin-Chu (TW); Mu-Chi Chiang, Hsinchu (TW); Yao-Kwang Wu, Hsinchu (TW); Bi-Fen Wu, Taichung (TW); Huan-Just Lin, Hsinchu (TW); Hsiao-Tzu Lu, Hsinchu (TW); Hui-Chi Huang, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 265 days.

(21) Appl. No.: 13/368,960

(22) Filed: Feb. 8, 2012

(65) Prior Publication Data

US 2013/0200461 A1     Aug. 8, 2013

(51) Int. Cl.
*H01L 27/118* (2006.01)
*H01L 29/66* (2006.01)

(52) U.S. Cl.
USPC .......................................... 257/204; 257/365

(58) Field of Classification Search
CPC ............ H01L 29/41775; H01L 23/481; H01L 23/5226
USPC ........................... 438/634, 221; 257/365, 204
See application file for complete search history.

(56) References Cited

U.S. PATENT DOCUMENTS

| | | | | |
|---|---|---|---|---|
| 8,017,997 | B2* | 9/2011 | Divakaruni et al. | 257/346 |
| 2006/0131646 | A1* | 6/2006 | Wu | 257/335 |
| 2006/0145219 | A1* | 7/2006 | Lim | 257/294 |
| 2007/0235823 | A1* | 10/2007 | Hsu et al. | 257/411 |
| 2009/0189137 | A1* | 7/2009 | Kinoshita et al. | 257/2 |
| 2009/0236633 | A1* | 9/2009 | Chuang et al. | 257/190 |
| 2010/0022061 | A1* | 1/2010 | Wu et al. | 438/301 |
| 2010/0062577 | A1* | 3/2010 | Liao et al. | 438/301 |
| 2011/0198675 | A1* | 8/2011 | Ng et al. | 257/288 |
| 2012/0139061 | A1* | 6/2012 | Ramachandran et al. | 257/410 |

* cited by examiner

*Primary Examiner* — Kevin Parendo
(74) *Attorney, Agent, or Firm* — Haynes and Boone, LLP

(57) ABSTRACT

A semiconductor device and method for fabricating a semiconductor device is disclosed. An exemplary semiconductor device includes a semiconductor substrate including a first device disposed in a first device region, the first device including a first gate structure, first gate spacers formed on the sidewalls of the first gate structure, and first source and drain features and a second device disposed in a second device region, the second device including a second gate structure, second gate spacers formed on the sidewalls of the second gate structure, and second source and drain features. The semiconductor device further includes a contact etch stop layer (CESL) disposed on the first and second gate spacers and interconnect structures disposed on the first and second source and drain features. The interconnect structures are in electrical contact with the first and second source and drain features and in contact with the CESL.

17 Claims, 10 Drawing Sheets

FIELD EFFECT TRANSISTORS AND METHOD OF FORMING THE SAME

BACKGROUND

The semiconductor integrated circuit (IC) industry has experienced rapid growth. In the course of the IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC manufacturing are needed.

For example, as the semiconductor industry has progressed into nanometer technology process nodes in pursuit of higher device density, higher performance, and lower costs, challenges from both fabrication and design have resulted in the development of multilayer integrated devices such as field effect transistor (FET). The FET device may include interlayer dielectric layers (ILD) having interconnects aligned with underlying layers. However, as the scaling down continues, aligning the interconnects of the ILD layers has proved difficult. Although existing FET devices and methods of fabricating FET devices have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1:
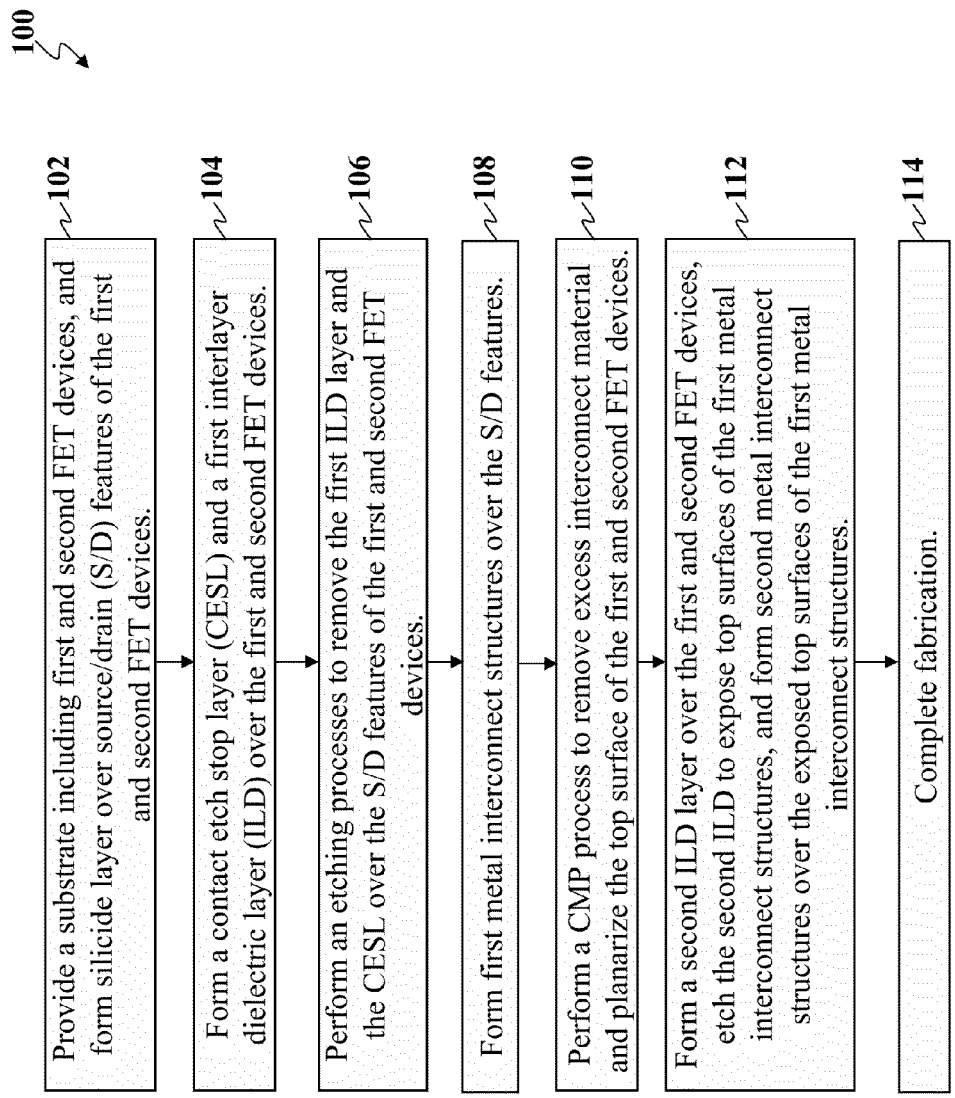
FIG. 1 is a flowchart illustrating a method of fabricating a semiconductor device according to various aspects of the present disclosure.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Also, the components disclosed herein may be arranged, combined, or configured in ways different from the exemplary embodiments shown herein without departing from the scope of the present disclosure. It is understood that those skilled in the art will be able to devise various equivalents that, although not explicitly described herein, embody the principles of the present invention.

Examples of devices that can benefit from one or more embodiments of the present invention are semiconductor devices. Such a device, for example, is a field effect transistor (FET). The FET device, for example, may be a complementary metal-oxide-semiconductor (CMOS) device comprising a P-type metal-oxide-semiconductor (PMOS) FET device and a N-type metal-oxide-semiconductor (NMOS) FET device. The following disclosure will continue with a semiconductor device including a FET device example to illustrate various embodiments of the present invention. It is understood, however, that the invention should not be limited to a particular type of device, except as specifically claimed.

With reference to FIGS. 1 and 2-9, a method 100 and a semiconductor device 200 are collectively described below. FIG. 1 is a flow chart of a method 100 for fabricating an integrated circuit device according to various aspects of the present disclosure. In the present embodiment, the method 100 is for fabricating an integrated circuit device. The method 100 begins at block 102 where a substrate including first and second devices is provided and a silicide layer is formed over source and drain (S/D) features of the first and second devices. At block 104, a contact etch stop layer (CESL) and a first interlayer dielectric layer (ILD) are formed over the first and second devices. The method continues with block 106 where an etching process is performed to remove portions of the first ILD layer over the S/D features of the first and second devices. The etching process may include multiple etching steps/process including dry etching, wet etching, or a combination of both. For example, a first etching process may stop on the CESL and a second etching process may stop on the silicide layer over the S/D features of the first and second devices. The etching process may include forming a patterned hardmask and etching the first ILD layer through openings of patterned hardmask. At block 108, first interconnect structures are formed over the S/D features of the first and second devices. At block 110, a CMP process is performed to remove excess interconnect material and the hardmask, and thus planarizing the top surface of the first and second devices. In an embodiment, in a gate last process, a gate replacement process is performed thereby replacing the gate structures (e.g., dummy gate structures) of the first and second devices with final gate structures. In alternative embodiments, in a gate first process, no gate replacement process is performed. At block 112, a second ILD layer is formed over the first and second devices, thereafter an etching process is performed on the second ILD layer to expose top surfaces of the first interconnect structures, and second interconnect structures are formed over the exposed top surfaces of the first interconnect structures. The method 100 continues with block 114 where fabrication of the integrated circuit device is completed. Additional steps can be provided before, during, and after the method 100, and some of the steps described can be replaced or eliminated for other embodiments of the method. The discussion that follows illustrates various embodiments of a semiconductor device that can be fabricated according to the method 100 of FIG. 1.

FIGS. 2-9 illustrate diagrammatic cross-sectional side views of one embodiment of a semiconductor device 200 at various stages of fabrication, according to the method of FIG. 1. In the present disclosure, the semiconductor device 200 includes a substrate 210 including regions 202 and 204 in which a NMOS device and a PMOS device may be formed, respectively. It is understood that part of the semiconductor device 200 may be fabricated by CMOS technology process flow, and thus some processes are only briefly described herein. Further, the semiconductor device 200 may include various other devices and features, such as other types of transistors such as bipolar junction transistors, resistors, capacitors, diodes, fuses, etc., but is simplified for a better understanding of the inventive concepts of the present disclosure. Accordingly, FIGS. 2-9 have been simplified for the sake of clarity to better understand the inventive concepts of the present disclosure. Additional features can be added in the semiconductor device 200, and some of the features described below can be replaced or eliminated in other embodiments of the semiconductor device 200.

Figure 2:
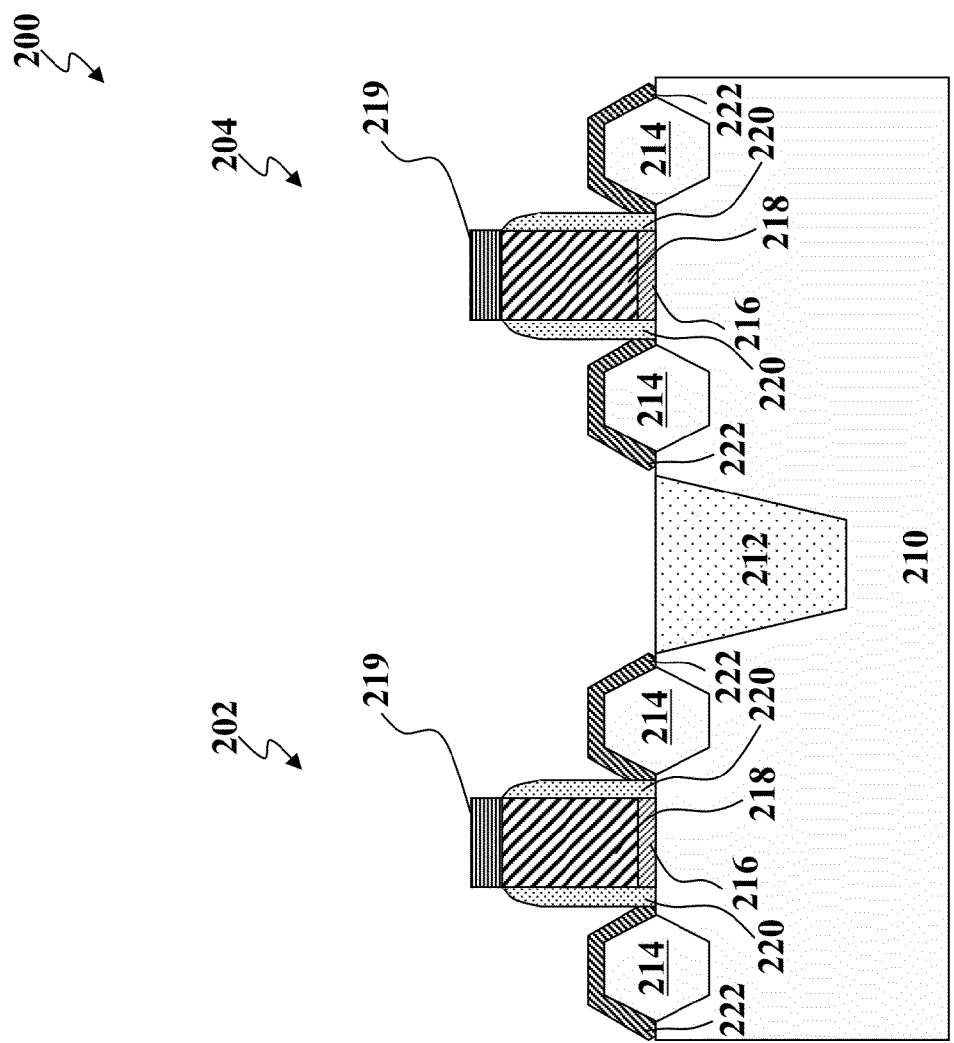
FIGS. 2-9 illustrate diagrammatic cross-sectional side views of one embodiment of a semiconductor device at various stages of fabrication, according to the method of FIG. 1.

Referring to FIG. 2, the substrate 210 (e.g., wafer) is a bulk silicon substrate. Alternatively, the substrate 210 comprises an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. Alternatively, the substrate 210 includes a silicon-on-insulator (SOI) substrate. The SOI substrate can be fabricated using separation by implantation of oxygen (SIMOX), wafer bonding, and/or other suitable methods. The substrate 210 may include various doped regions and other suitable features.

In the present embodiment, the substrate 210 includes an isolation region 212 to define and isolate various active regions of the substrate 210. The isolation region 212 utilizes isolation technology, such as shallow trench isolation (STI) or local oxidation of silicon (LOCOS), to define and electrically isolate the various regions. The isolation region 212 includes silicon oxide, silicon nitride, silicon oxynitride, other suitable materials, or combinations thereof.

The NMOS device 202 and the PMOS device 204 device each include source/drain (S/D) regions including lightly doped S/D features and heavy doped S/D features. The S/D features may be formed by implanting p-type or n-type dopants or impurities into the substrate 210 depending on the configuration of the transistors 202, 204. S/D features 214 may be formed in the S/D regions by methods including thermal oxidation, polysilicon deposition, photolithography, ion implantation, etching, and various other methods. S/D features 214 may be raised S/D features formed by an epitaxy process.

Still referring to FIG. 2, the NMOS device 202 and the PMOS device 204 may each include a gate dielectric layer 216 including an interfacial layer/high-k dielectric layer formed over the substrate 210. The interfacial layer may include a silicon oxide layer (SiO2) or silicon oxynitride (SiON) having a thickness ranging from about 5 to about 10 angstroms formed on the substrate 210. The high-k dielectric layer may be formed on the interfacial layer by atomic layer deposition (ALD) or other suitable technique. The high-k dielectric layer may include a thickness ranging from about 10 to about 40 angstroms. The high-k dielectric layer may include hafnium oxide (HfO2). Alternatively, the high-k dielectric layer may optionally include other high-k dielectrics, such as TiO2, HfZrO, Ta2O3, HfSiO4, ZrO2, ZrSiO2, combinations thereof, or other suitable material. Further, the high-k gate dielectric layer may include a multiple layer configuration such as HfO2/SiO2 or HfO2/SiON.

The NMOS device 202 and the PMOS device 204 each further include gate structures 218 formed over the gate dielectric layer 216. Processing may utilize a gate first process or a gate last process. The gate first process includes forming a final gate structure over the gate dielectric layer 216. Forming the final gate structures may include forming a plurality of layers. For example, an interface layer, a dielectric layer, a high-k layer, a capping layer, a work function metal, and a gate electrode may be deposited and be included in the final gate structure. The gate last process includes forming dummy gate structures and, in subsequent processing, performing a gate replacement process that includes removing the dummy gate structures and forming final gate structures. Forming the final gate structures may include forming a plurality of layers. For example, an interface layer, a dielectric layer, a high-k layer, a capping layer, a work function metal, and a gate electrode may be deposited and be included in the final gate structures. As described below, the gate last process may include forming the high-k layer first or last.

In the present embodiment, the gate structures 218 are dummy structures. The gate structures 218 may be formed by methods including thermal oxidation, polysilicon deposition, photolithography, etching, and various other methods. Formed over the gate structures 218 is a hardmask 219. The hardmask 219 may be formed by any suitable process to any suitable thickness. In the gate last process, the gate structures 218 of the NMOS and PMOS devices 202, 204 may be removed and replaced with metal gate structures as discussed below. Gate spacers 220 are formed on the sidewalls of the gate structures 218 and on the substrate 210. The gate spacers 220 are formed by any suitable process to any suitable thickness. The gate spacers 220 include a dielectric material, such as silicon nitride, silicon oxide, silicon oxynitride, other suitable materials, and/or combinations thereof.

Formed over the S/D features 214 of the NMOS device 202 and the PMOS device 204 is a silicide layer 222. The silicide layer 222 reduces the contact resistance of subsequently formed contacts/interconnects. Forming the silicide layer 222 may include a self-aligned silicide technique. As an embodiment of a procedure to form the fully silicide layer 222 metal layer is deposited on the S/D features 214. The metal layer for silicide includes titanium, nickel, cobalt, platinum, palladium tungsten, tantalum or erbium in various embodiment. The metal layer contacts the silicon within the S/D features 214 of the NMOS device 202 and the PMOS device 204. An annealing process with a proper temperature is applied to the semiconductor device 200 such that the metal layer and the silicon of the S/D features 214 react to form silicide. The formed silicide layer 222 may be in any proper composition and phase, determined by various parameters including the annealing temperature and the thickness of the metal layer. In some embodiments, a metal barrier may be formed over the silicide layer, thereby improving reliability. Because the hardmask 219 overlies the gate structures 218, forming the silicide layer 222 does not affect the gate structures 218 (e.g., no metal is deposited on the gate structures 218).

Figure 3:
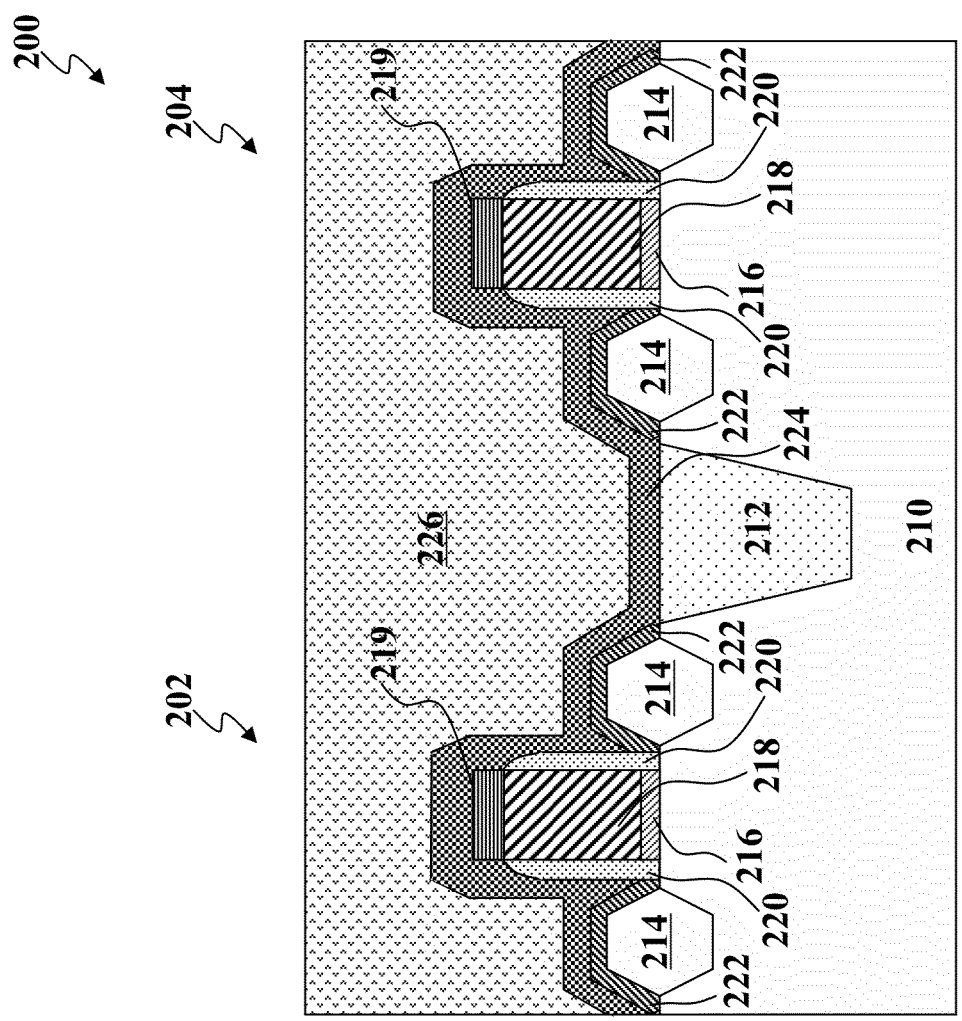

Referring to FIG. 3, formed over the NMOS device 202 and the PMOS device 204 is a contact etch stop layer (CESL) 224. The CESL 224 may be formed of silicon nitride, silicon oxynitride, and/or other suitable materials. A first dielectric layer such as an inter-layer (or level) dielectric (ILD) layer 226 may be formed overlying the CESL 224. The first ILD layer 226 may include silicon oxide, silicon oxynitride, a low-k material, or other suitable materials. The first ILD layer 226 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

Figure 4:
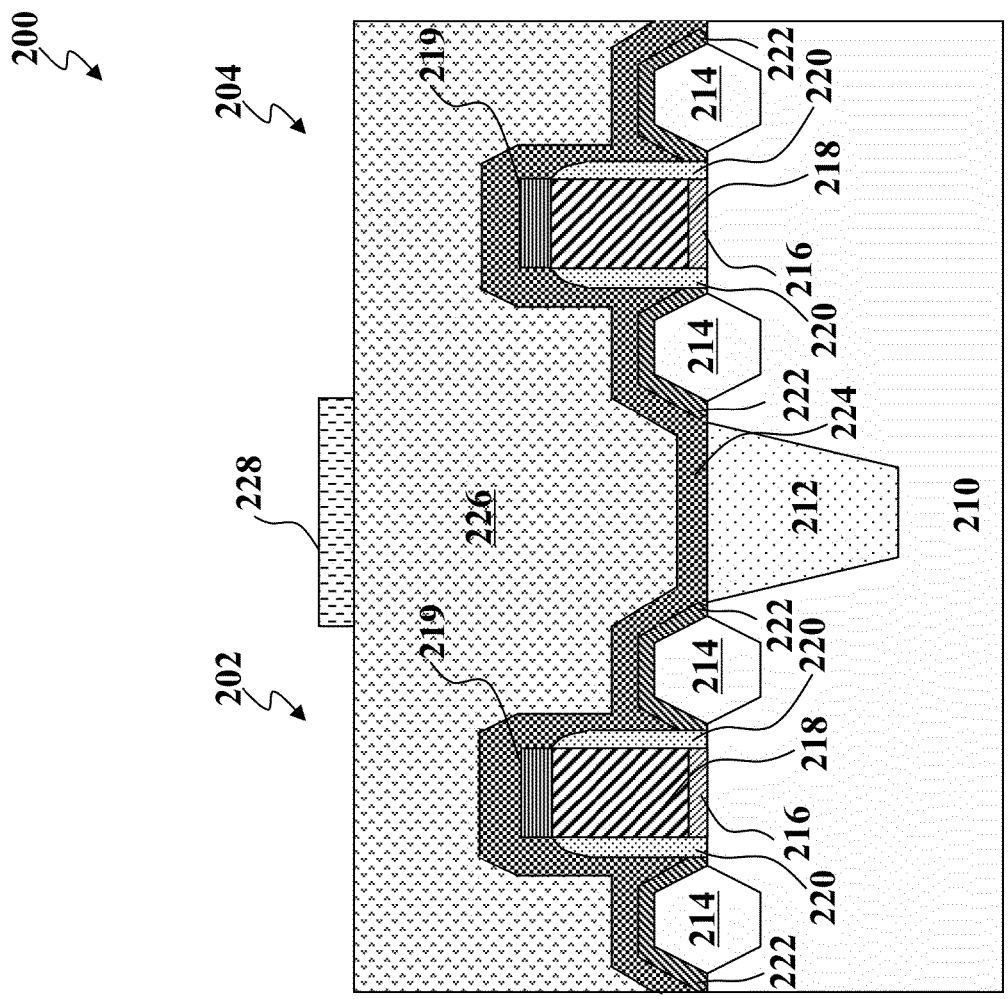

Referring to FIG. 4, a hardmask 228 is formed and patterned over the isolation region 212 to define regions where the first ILD layer 226 and the CESL 224 will be subsequently etched and an interconnect structure will be formed. The patterned hardmask 228 may include a material such as silicon nitride, silicon oxynitride, silicon carbide, silicon carbon nitride, other suitable material, or combinations thereof. In the present embodiment, the hardmask 228 includes silicon nitride and is formed by a chemical vapor deposition (CVD) process. In various examples, the silicon nitride can be formed by physical vapor deposition (PVD), atomic layer deposition (ALD), high density plasma CVD (HDPCVD), other suitable methods, and/or combinations thereof. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6).

The hardmask 228 is patterned by any suitable process, such as a photolithography process. In the present embodiment, the hardmask 228 is patterned by exposing a photoresist layer to a pattern, performing a post-exposure bake process, and developing the photoresist layer to form the patterned hardmask 228. The photoresist layer patterning may include processing steps of photoresist coating, soft baking, mask aligning, exposing pattern, post-exposure baking, developing photoresist, and hard baking. The patterning may also be implemented or replaced by other proper methods, such as maskless photolithography, electron-beam writing, ion-beam writing, and molecular imprint. Notably, because the ILD layer 226 will be removed over the S/D features 214 and the CESL 220 protects the gate spacers 220, the hardmask 228 tolerances are not critical. In other words, the openings which will result from subsequent etching will be self-aligned with the underlying S/D features 214. As described below, the patterned hardmask 228 is used in an etching process to etch the first ILD layer 226 and the CESL 224 over the NMOS device 202 and the PMOS device 204.

Figure 5:
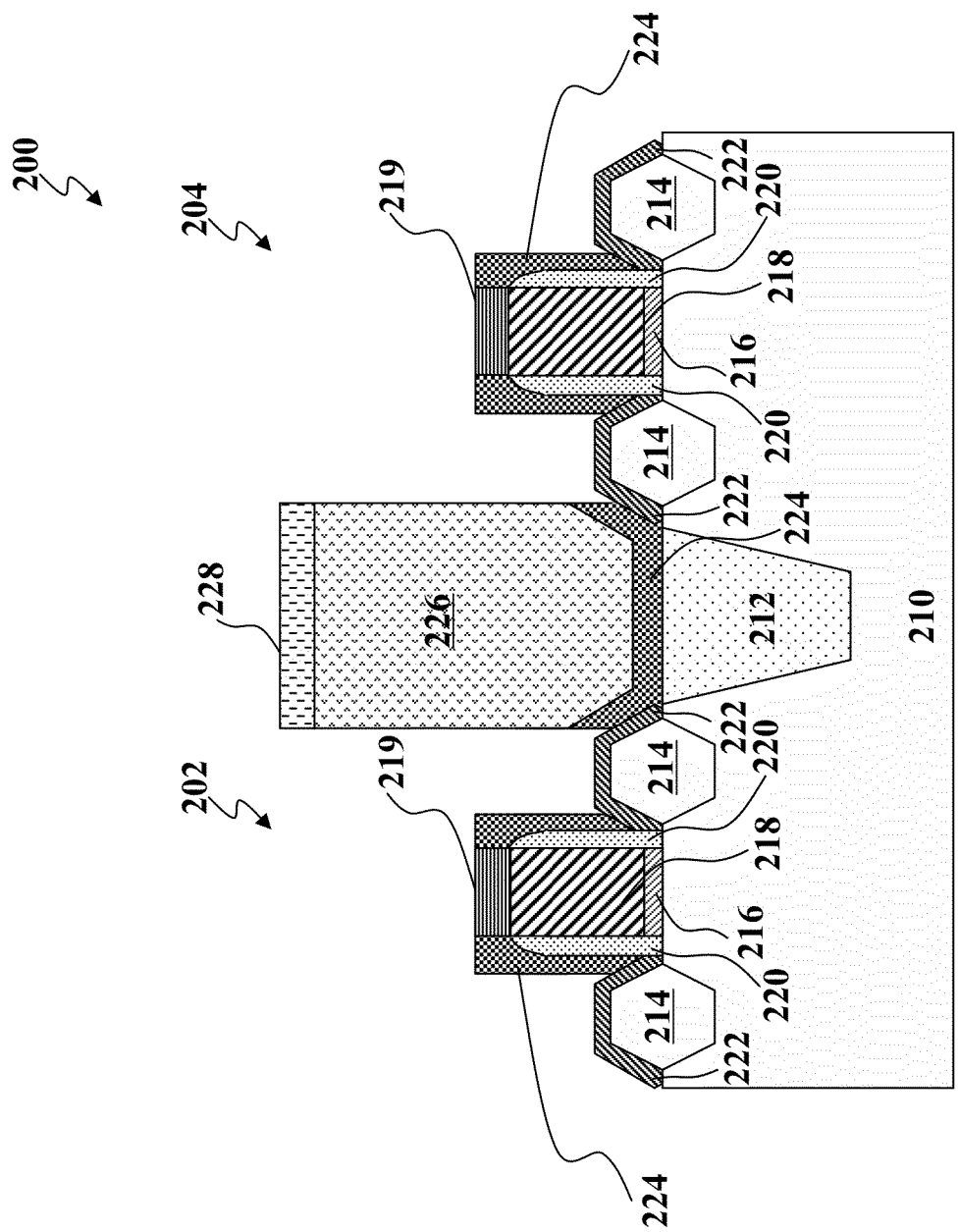

Referring to FIG. 5, the first ILD layer 226 and the CESL 224 over the S/D features 214 of the NMOS device 202 and the PMOS device 204 is removed by an etching process, thereby exposing the silicide layer 222. The etching process uses the hardmask 228 to define the area to be etched. The etching process may be a single or a multiple step etching process. For example, the etching process may be a multiple step etching process that first etches the first ILD layer 226 and stops on CESL 224 and second etches the CESL 224, thereby exposing the silicide layer 222 over the S/D features 214. The etching process may include wet etching, dry etching, or a combination thereof. The dry etching process may be an isotropic etching process. The etching process may use reactive ion etch (RIE) and/or other suitable process. In one example, a dry etching process is used to etch the first ILD layer 226 and the CESL 224 that includes a chemistry including fluorine-containing gas. In furtherance of the example, the chemistry of the dry etch includes CF4, SF6, or NF3. As illustrated, in the present embodiment, the etching process is isotropic and therefore removes the top portions of the CESL over the S/D features 214 and the top portions of the CESL over the hardmask 219 over the gate structures 218.

Figure 6:
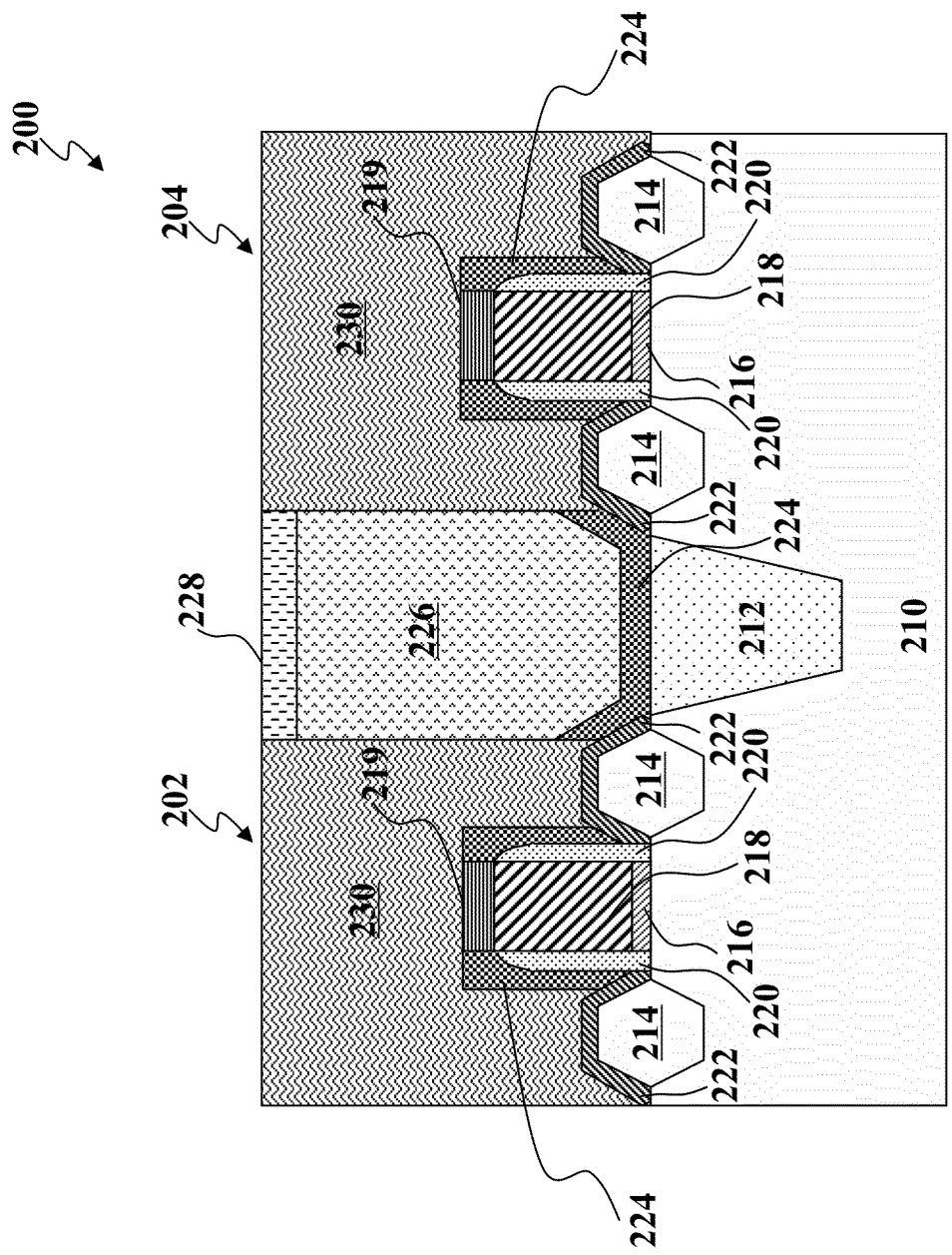

Referring to FIG. 6, first interconnect structures 230 are formed for connecting to the S/D features 214 of the NMOS 202 and PMOS 204 devices, and other devices/features of the semiconductor device 200. In some embodiments, the first interconnect structures 230 are formed directly on the silicide layer 222. In alternative embodiments, the first interconnect structures 230 are formed over a metal barrier that is formed over the silicide layer 222 such that the first interconnect structures 230 are in electrical contact with the silicide layer 222. The first interconnect structures 230 may include a metal such as aluminum (Al), tungsten (W), and copper (Cu). The first interconnect structures 230 may be formed by chemical vapor deposition (CVD), physical vapor deposition (PVD), atomic layer deposition (ALD), high density plasma CVD (HDPCVD), plating, other suitable methods, and/or combinations thereof. As illustrated, the first interconnect structures 230 are disposed over the silicide layer 222 and in electrical contact with the S/D features 214. The first interconnect structures 230 are also in contact with the CESL 224 on the gate spacers 220 of the gate structures 218 of the NMOS and PMOS devices 202, 204.

Figure 7:
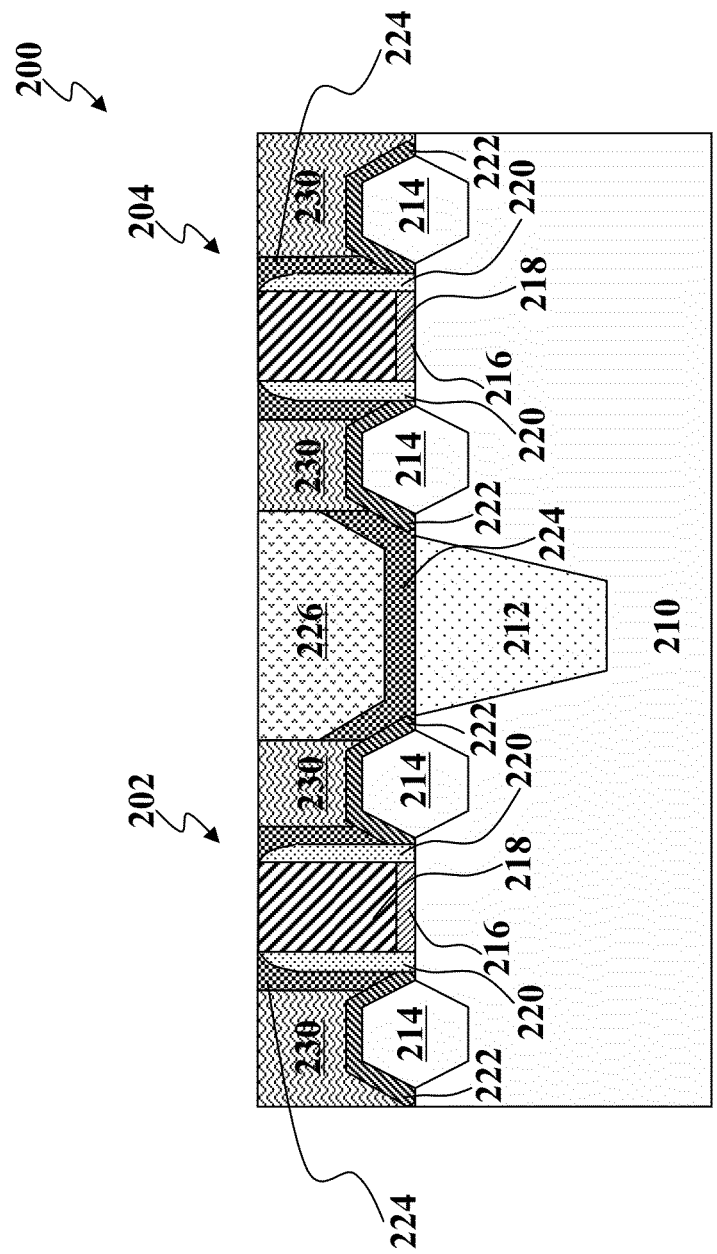

Referring to FIG. 7, a portion of the first interconnect structures 230, the ILD layer 226, the hardmask 219, and the hardmask 228 may be removed and the surface of the semiconductor device 200 planarized by a chemical mechanical polishing (CMP) process. The CMP process may use the hardmask 219 as a signaling element, thereby signaling that sufficient material has been removed. In the present embodiment, the hardmask 219 is removed and a top portion of the gate structures 218 of the NMOS device 202 and the PMOS device 204 is exposed. In an alternative embodiment, part of the hardmask 219 remains and the a top portion of the gate structures 218 of the NMOS device 202 and the PMOS device 204 is not exposed.

Figure 8:
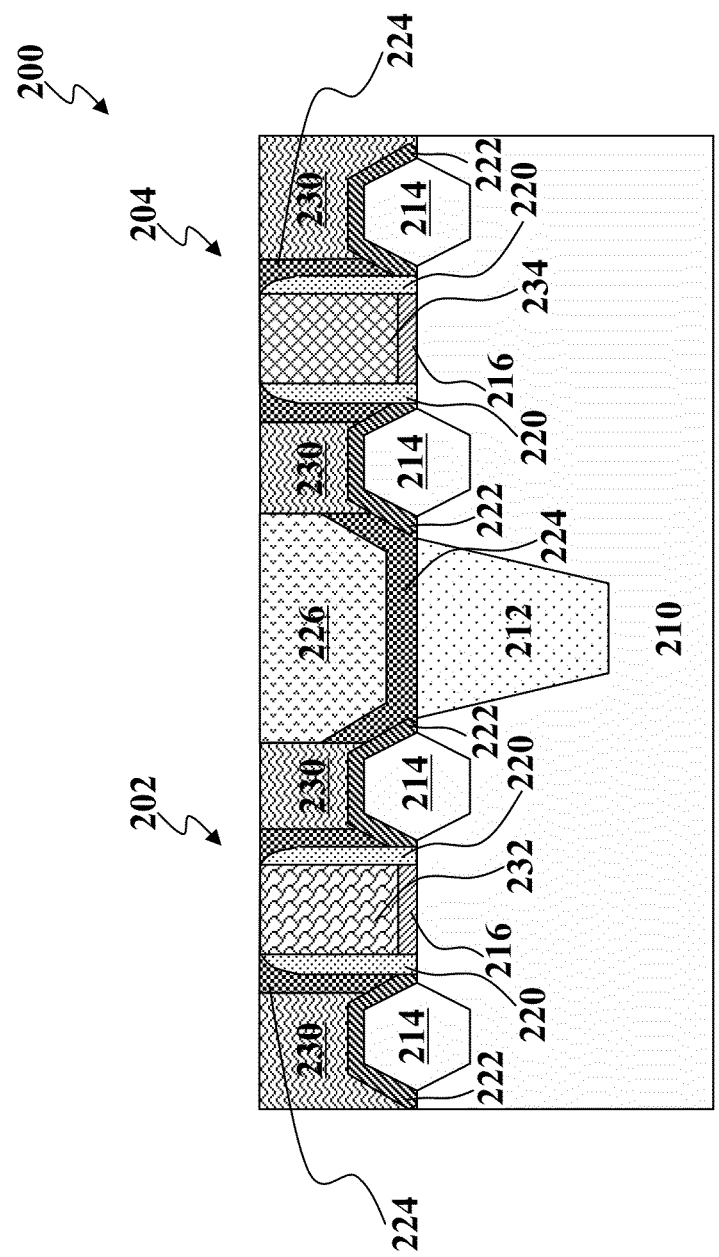

Referring to FIG. 8, in the present embodiment, because the process is a gate last process, the gate structures 218 (which are dummy gate structures) are removed in both the NMOS device 202 and PMOS device 204 by an etch back process or other suitable process. In embodiments where the gate last process utilizes a high-k first process, the high-k material that was previously formed is not removed. Alternatively, in embodiments where the gate last process utilizes a high-k last process, the high-k material that was previously formed is removed and a final high-k material is formed over the substrate 210. Further, a final gate structure 232 of the NMOS device 202 and a final gate structure 234 of the PMOS 204 is formed after removal of the gate structures 218. Forming the final gate structure 232, 234 may include forming a plurality of layers. For example, an interface layer, a dielectric layer, a high-k layer, a capping layer, a work function metal, and a gate electrode may be deposited and be included in the final gate structure 232, 234. A suitable work function metal may be selected for the NMOS device 202 and may include for example, TiAl, TaN, and a suitable function metal may be selected for the PMOS device 204 and may include, for example, TaN, WN. Alternatively the work function metal may be any suitable metal. Notably, the work function metal of the NMOS device 202 and the PMOS device 204 may be different or the same. The material of the gate electrode of the final gate structure 232 may include material suitable such as a metal including Al, W, or Cu or polysilicon. Notably, the gate electrode of the NMOS device 202 and the PMOS device 204 may be different or the same. The final gate structure 232, 234 may be formed by chemical vapor deposition (CVD), physical vapor deposition (PVD), atomic layer deposition (ALD), high density plasma CVD (HDPCVD), plating, other suitable methods, and/or combinations thereof. It is understood that in an alternative embodiment that utilizes a gate first process no gate replacement step is necessary as the gate structures are final gate structures.

Figure 9:
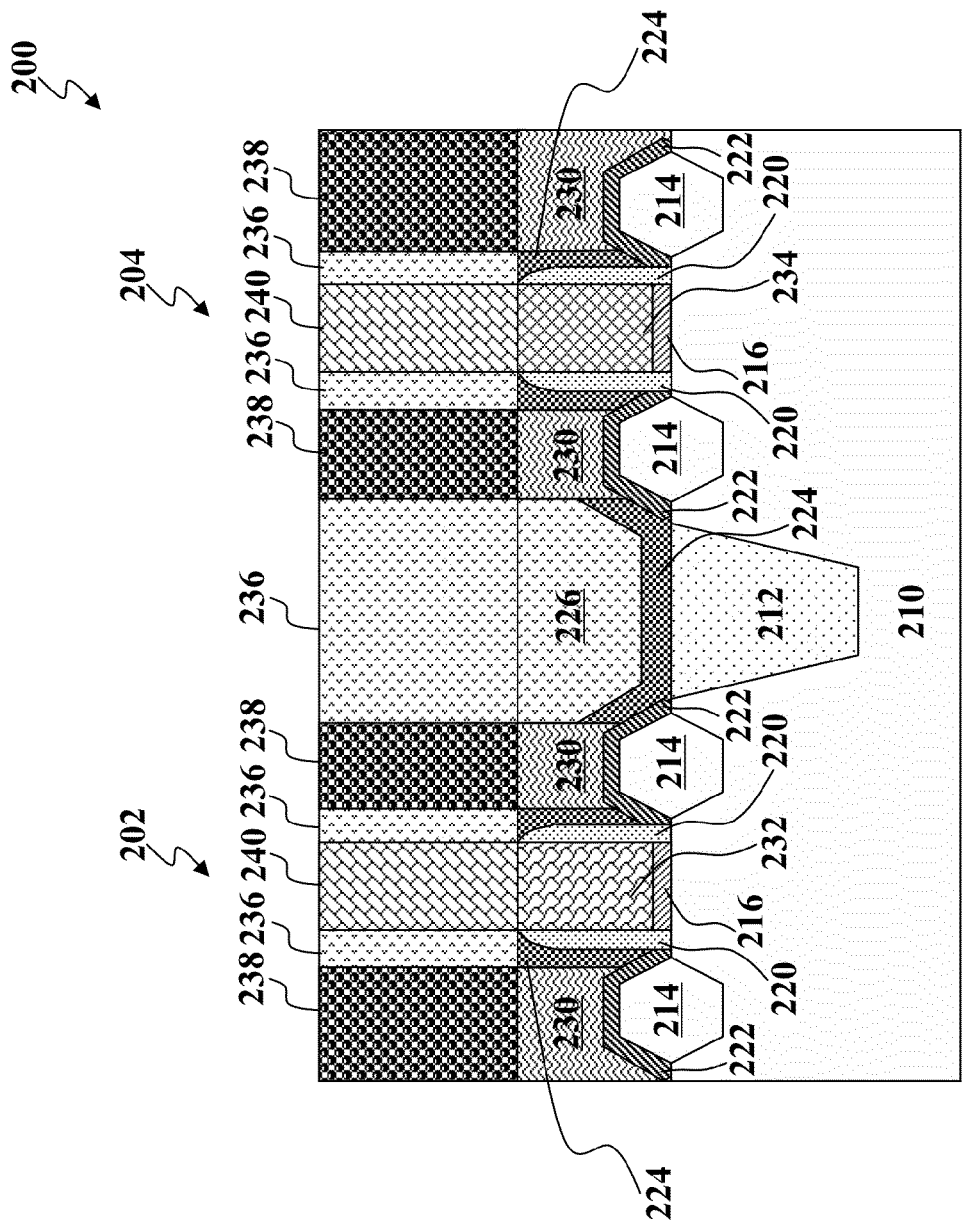

Referring to FIG. 9, a second ILD layer 236 is formed over the semiconductor device 200. The second ILD layer 236 may include silicon oxide, silicon oxynitride, a low-k material, or other suitable materials. The second ILD layer 236 may be formed by chemical vapor deposition (CVD), high density plasma CVD (HDP-CVD), spin-on, physical vapor deposition (PVD or sputtering), or other suitable methods. The CVD process, for example, may use chemicals including Hexachlorodisilane (HCD or Si2Cl6), Dichlorosilane (DCS or SiH2Cl2), Bis(TertiaryButylAmino) Silane (BTBAS or C8H22N2Si) and Disilane (DS or Si2H6). As illustrated, the second ILD layer 236 may be formed on the CESL 224, on the gate spacers 220 of the gate structures 232, 234 of the NMOS and PMOS devices 202, 204, and on the first ILD layer 226 on the STI feature 212.

Still referring to FIG. 9, a second interconnect structures 238 are formed through the second ILD layer 236. The second interconnect structures 238 may be formed by first etching a trench within the second ILD layer 236 over the first interconnect structures 230 of the S/D features 214 and over the gate structure 232, and second depositing a material within the etched trench. The etching process may be a single or a multiple step etching process. The etching process may include wet etching, dry etching, or a combination thereof. The etching process may use reactive ion etch (RIE) and/or other suitable process. In one example, a dry etching process is used to etch the second ILD layer 236 includes a chemistry including fluorine-containing gas. In furtherance of the example, the chemistry of the dry etch includes CF4, SF6, or NF3. The second interconnect structures 238 may be formed through etched portions of the second ILD layer 236 for connecting to the first interconnect structures 230 and to the S/D features 214 of the NMOS 202 and PMOS 204 devices, and other devices/features of the semiconductor device 200. The second interconnect structures 238 may include a metal such as Al, W, or Cu. The second interconnect structures 238 may be formed by chemical vapor deposition (CVD), physical vapor deposition (PVD), atomic layer deposition (ALD), high density plasma CVD (HDPCVD), plating, other suitable methods, and/or combinations thereof. A gate contact 240 may be formed through etched portions of the second ILD layer 236 for connecting to the gate structure 232 of the NMOS 202 and PMOS 204 devices. The gate contact 240 may include a metal such as Al, W, or Cu or polysilicon, or other suitable materials.

Figure 10:
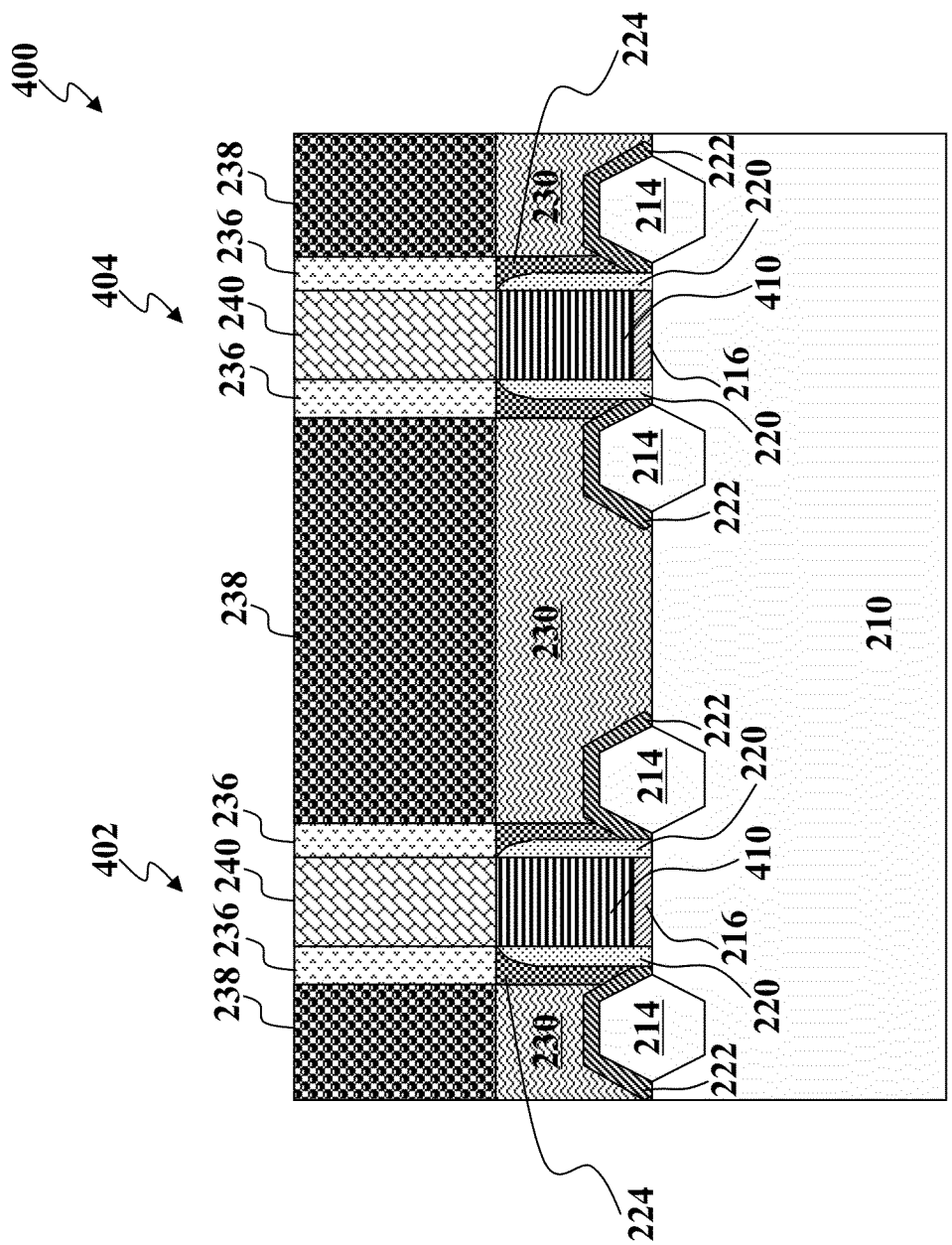
FIG. 10 illustrates a diagrammatic cross-sectional side view of one embodiment of a semiconductor device at a stage of fabrication, according to the method of FIG. 1.

Referring to FIG. 10, illustrated is a semiconductor device 400 according to various aspects of the present disclosure. The semiconductor device 400 of FIG. 10 is similar in certain respects to the semiconductor device 200 of FIGS. 2-9. Accordingly, similar features in FIGS. 2-9 and FIG. 10 are identified by the same reference numerals for clarity and simplicity. The semiconductor device 400 may include various devices and features, such as various types of transistors, resistors, capacitors, diodes, fuses, etc., but is simplified for a better understanding of the inventive concepts of the present disclosure. Accordingly, FIG. 10 has been simplified for the sake of clarity to better understand the inventive concepts of the present disclosure. Additional features can be added in the semiconductor device 400, and some of the features described below can be replaced or eliminated in other embodiments of the semiconductor device 400.

Still referring to FIG. 10, the semiconductor device 400 includes substrate 210. In the present embodiment, the substrate 210 defined in the semiconductor device 400 is substantially similar to the substrate 210 of the semiconductor device 200 in terms of composition, formation and configuration. In an alternative embodiment, they are different. The substrate 210 of the semiconductor device 400 includes a first FET device 402 and a second FET device 404. The first FET device 402 and the second FET device 404 are of the same type of devices. For example, both the first and second FET device 402, 404 are NMOS FET devices. Alternatively, both the first and second FET device 402, 404 are PMOS FET devices. The first and second FET device 402, 404 defined in the semiconductor device 400 are substantially similar to either the NMOS device 202 or the PMOS device 204 of the semiconductor device 200 in terms of composition, formation and configuration. As such, the first and second FET device 402, 404 include features such as source and drain (S/D) features 214, a gate dielectric layer 215, a final gate structure 410 (similar to 232 or 234 of semiconductor device 200), a silicide layer 222 formed over the S/D features 214, a contact etch stop layer (CESL) 224 formed on sidewalls of gate spacers 220, a first interconnect structures 230, second interlayer dielectric (ILD) layer 236, second interconnect structures 238, and gate contact 240, which may be substantially similar to the features of either the NMOS device 202 or the PMOS device 204 of the semiconductor device 200 in terms of composition, formation and configuration. A few points of distinction, for example, may be that the semiconductor device 400 may not include an STI feature, the first interconnect structures 230 may be shared or common among the S/D features 214 of both the first and second FET device 402, 404, and the materials of the features of the first and second FET device 402, 404 may be common amongst both devices. The semiconductor device 400 may be formed at the same time as the semiconductor device 200 and both devices 200, 400 may be included in a final semiconductor device and may be adjacent one to the other.

The above method 100 provides for an improved alignment (self-alignment) process to form interconnect structures of the ILD layer thereby improving the overlay control and reducing manufacturing cost when compared with traditional manufacturing processes. For example, because the first ILD layer is only patterned over the isolation region 212 and substantially removed over the S/D features the opening dimensions are not critical, thus allowing for proper/self alignment of the first interconnect structures with the S/D features and improved overlay control which ultimately reduces manufacturing cost. Further, the method 100 provides for a device having a constant isolated space between the gate structure and the interconnect structures of the ILD layer. Further, the method 100 can be easily implemented into current manufacturing process and technology, thereby lowering cost and minimizing complexity. Different embodiments may have different advantages, and no particular advantage is necessarily required of any embodiment.

Thus, provided is a semiconductor device. The exemplary semiconductor device includes a semiconductor substrate including a first device region, a second device region, and a region between the first and second device regions. The semiconductor device further includes a first device disposed in the first device region, the first device including a first gate structure, first gate spacers formed on the sidewalls of the first gate structure, and first source and drain features and a second device disposed in the second device region, the second device including a second gate structure, second gate spacers formed on the sidewalls of the second gate structure, and second source and drain features. The semiconductor device further includes a contact etch stop layer (CESL) disposed on the first and second gate spacers and interconnect structures disposed on the first and second source and drain features, the interconnect structures being in electrical contact with the first and second source and drain features and in contact with the CESL disposed on the first and second gate spacers.

In some embodiments, the semiconductor further includes an isolation feature disposed in the region between the first and second device regions and an interlayer dielectric (ILD) layer disposed over the isolation feature. In various embodiments, the semiconductor device further includes a silicide layer disposed on the first and second source and drain features, the silicide layer being interposed between the first and second source and drain features and the interconnect structures. In further embodiments, the semiconductor device further includes a metal barrier disposed on the first and second source and drain features, the metal barrier being interposed between the silicide layer and the interconnect structures.

In some embodiments, the interconnect structures traverse the region between the first and second device regions and are in electrical contact with the first and second source and drain regions. In various embodiments, the first device is a N-type metal-oxide-semiconductor (NMOS) field effect transistor (FET) device, and the second device is a P-type metal-oxide-semiconductor (PMOS) FET device. In certain embodiments, the first and second devices are NMOS FET devices. In other embodiments, the first and second devices are PMOS FET devices Also provided is an alternative embodiment of a semiconductor device. The exemplary semiconductor device includes a substrate including a N-type metal-oxide-semiconductor (NMOS) device, a P-type metal-oxide-semiconductor (PMOS) device, and a shallow trench isolation (STI) feature separating the NMOS and PMOS devices, wherein the NMOS device includes a gate structure and gate spacers formed on sidewalls of the gate structure, the gate structure of the NMOS device separating n-type source and drain features, and wherein the PMOS device includes a gate structure and gate spacers formed on sidewalls of the gate structure, the gate structure of the PMOS device separating p-type source and drain features. The semiconductor device further includes a silicide layer disposed on the n-type and p-type source and drain features. The semiconductor device further includes a contact etch stop layer (CESL) disposed on the gate spacers of the NMOS and PMOS devices and on the STI feature. The semiconductor device further includes an interlayer dielectric (ILD) layer disposed on the CESL over the STI feature. The semiconductor device further includes interconnect structures disposed on the silicide layer over the n-type and p-type source and drain features, the interconnect structures being formed on the CESL on the gate spacers of the NMOS and PMOS devices.

In some embodiments, the semiconductor device further includes another interlayer dielectric (ILD) layer disposed on the CESL on the gate spacers of NMOS and PMOS devices and on the ILD layer over the STI feature and another interconnect structures disposed on the interconnect structures and interposed between the another ILD layer. In certain embodiments, the semiconductor device further includes another NMOS device adjacent to the NMOS device, wherein the another NMOS device includes a gate structure and gate spacers formed on sidewalls of the gate structure, the gate structure of the another NMOS device separating n-type source and drain features, another silicide layer formed on the n-type source and drain features of the another NMOS device; and another contact etch stop layer (CESL) disposed on the gate spacers of the another NMOS device, wherein the another NMOS device shares a common interconnect structure of the interconnect structures with the NMOS device, wherein the common interconnect structure is disposed on the another silicide layer of the another NMOS device and on the silicide layer of the NMOS device, wherein the common interconnect structure is in contact with the another CESL disposed on the gate spacers of the another NMOS device and in contact with the CESL disposed on the gate spacers of the NMOS device. In various embodiments, the semiconductor device further includes another PMOS device adjacent to the PMOS device, wherein the another PMOS device includes a gate structure and gate spacers formed on sidewalls of the gate structure, the gate structure of the another PMOS device separating p-type source and drain features; another contact etch stop layer (CESL) disposed on the gate spacers of the another NMOS device; and another silicide layer formed on the p-type source and drain features of the another PMOS device, wherein the another PMOS device shares a common interconnect structure of the interconnect structures with the PMOS device, wherein the common interconnect structure is disposed on the another silicide layer and on the silicide layer, wherein the common interconnect structure is in contact with the another CESL disposed on the gate spacers of the gate structure of the another PMOS device and in contact with the CESL disposed on the gate spacers of the gate structure of the PMOS device.

In some embodiments, the interconnect structures include a material selected from the group consisting of aluminum (Al), tungsten (W), and copper (Cu).

Also provided is a method of forming a CMOS device. The exemplary method includes providing a substrate including a first device, a second device, and a region between the first and second devices. The first device includes a first gate structure, first gate spacers, and first source and drain features, and the second device includes a second gate structure, second gate spacers, and second source and drain features. The method further includes forming a silicide layer disposed on the first and second source and drain features. The method further includes forming a contact etch stop layer (CESL) on the gate spacers of the first and second devices and in the region between the first and second devices. The method further includes forming an interlayer dielectric (ILD) layer on the CESL in the region between the first and second devices. The method further includes forming interconnect structures on the silicide layer over the first and second source and drain features and on the CESL on the gate spacers of the first and second devices.

In some embodiments, the gate structure is formed by a gate last process, the gate last process including removing a dummy gate and forming a metal gate. In other embodiments the gate structure is formed by a gate first process. In various embodiments, the region between the first and second devices includes an isolation feature. In certain embodiments, the semiconductor device is a complementary metal-oxide-semiconductor (CMOS) field effect transistor (FET) device, the first device is a N-type metal-oxide-semiconductor (NMOS) FET device of the CMOS FET device, and the second device is a P-type metal-oxide-semiconductor (PMOS) FET device of the CMOS FET device. In some embodiments, the first and second devices are NMOS FET devices. In various embodiments, the first and second devices are PMOS FET devices.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
a semiconductor substrate including a first device region, a second device region, a third device region, a region between the first and second device regions, and a shallow trench isolation (STI) feature between the second and third device regions;
a first device of a first type disposed in the first device region, the first device of the first type including a first gate structure, first gate spacers formed on the sidewalls of the first gate structure, and first source and drain features;
a second device of the first type disposed in the second device region, the second device of the first type including a second gate structure, second gate spacers formed on the sidewalls of the second gate structure, and second source and drain features;
a third device of a second type disposed in the third device region, the third device of the second type including a third gate structure, third gate spacers formed on the sidewalls of the third gate structure, and third source and drain features;
a contact etch stop layer (CESL) disposed on the first, second, third gate spacers, and on the STI feature between the second and third device regions;
a silicide layer disposed on the source and drain features of the first source and drain features, the second source and drain features, and the third source and drain features;
an interconnect structure disposed on the silicide layer over the third source and drain features, the interconnect structure being in direct contact with the CESL disposed on the third gate spacers; and
a common interconnect structure disposed on the first and second source and drain features, the common interconnect structure traversing the region between the first and second device regions and in electrical contact with the first and second source and drain features and in contact with the CESL disposed on the first and second gate spacers,
wherein a top surface of the first gate structure, a top surface of the second gate structure, and a top surface of the CESL are in a common plane.

2. The semiconductor device of claim 1 further comprising:
an isolation feature disposed in the region between the first and second device regions; and
an interlayer dielectric (ILD) layer disposed over the isolation feature.

3. The semiconductor device of claim 1 further comprising:
a silicide layer disposed on the first and second source and drain features, the silicide layer being interposed between the first and second source and drain features and the interconnect structures.

4. The semiconductor device of claim 3 further comprising:
a metal barrier disposed on the first and second source and drain features, the metal barrier being interposed between the silicide layer and the interconnect structures.

5. The semiconductor device of claim 1 wherein the first and second devices are N-type metal-oxide-semiconductor (NMOS) field effect transistor (FET) devices, and
wherein the third device is a P-type metal-oxide-semiconductor (PMOS) FET device.

6. The semiconductor device of claim 1 wherein the first and second devices are NMOS FET devices.

7. The semiconductor device of claim 1 wherein the first and second devices are PMOS FET devices.

8. A semiconductor device comprising:
a substrate including a N-type metal-oxide-semiconductor (NMOS) device, a P-type metal-oxide-semiconductor (PMOS) device, and a shallow trench isolation (STI) feature separating the NMOS and PMOS devices, wherein the NMOS device includes a gate structure and gate spacers formed on sidewalls of the gate structure, the gate structure of the NMOS device separating n-type source and drain features, and wherein the PMOS device includes a gate structure and gate spacers formed on sidewalls of the gate structure, the gate structure of the PMOS device separating p-type source and drain features;
a silicide layer disposed on the n-type and p-type source and drain features;
a contact etch stop layer (CESL) disposed on the gate spacers of the NMOS and PMOS devices and on the STI feature;
an interlayer dielectric (ILD) layer disposed on the CESL over the STI feature;
interconnect structures disposed on the silicide layer over the n-type and p-type source and drain features, the interconnect structures being formed on the CESL on the gate spacers of the NMOS and PMOS devices;
another PMOS device adjacent to the PMOS device, wherein the another PMOS device includes a gate structure and gate spacers formed on sidewalls of the gate structure, the gate structure of the another PMOS device separating p-type source and drain features;
another contact etch stop layer (CESL) disposed on the gate spacers of the another PMOS device; and
another silicide layer formed on the p-type source and drain features of the another PMOS device,
wherein the another PMOS device shares a common interconnect structure of the interconnect structures with the PMOS device, wherein the common interconnect structure is disposed on the another silicide layer and on the silicide layer, wherein the common interconnect structure is in contact with the another CESL disposed on the gate spacers of the gate structure of the another PMOS device and in contact with the CESL disposed on the gate spacers of the gate structure of the PMOS device,
wherein a top surface of the first gate structure, a top surface of the second gate structure, and a top surface of the interconnect structures are in a common plane.

9. The semiconductor device of claim 8 further comprising:
another interlayer dielectric (ILD) layer disposed on the CESL on the gate spacers of NMOS and PMOS devices and on the ILD layer over the STI feature; and
another interconnect structures disposed on the interconnect structures and interposed between the another ILD layer.

10. The semiconductor device of claim 8 wherein the interconnect structures include a material selected from the group consisting of aluminum (Al), tungsten (W), and copper (Cu).

11. A semiconductor device comprising:
a substrate including a N-type metal-oxide-semiconductor (NMOS) device, a P-type metal-oxide-semiconductor (PMOS) device, and a shallow trench isolation (STI) feature separating the NMOS and PMOS devices, wherein the NMOS device includes a gate structure and gate spacers formed on sidewalls of the gate structure, the gate structure of the NMOS device separating n-type source and drain features, and wherein the PMOS device includes a gate structure and gate spacers formed on sidewalls of the gate structure, the gate structure of the PMOS device separating p-type source and drain features;

a silicide layer disposed on the n-type and p-type source and drain features;

a contact etch stop layer (CESL) disposed on the gate spacers of the NMOS and PMOS devices and on the STI feature;

an interlayer dielectric (ILD) layer disposed on the CESL over the STI feature; and interconnect structures disposed on the silicide layer over the n-type and p-type source and drain features, the interconnect structures being formed on the CESL on the gate spacers of the NMOS and PMOS devices;

another NMOS device adjacent to the NMOS device, wherein the another NMOS device includes a gate structure and gate spacers formed on sidewalls of the gate structure, the gate structure of the another NMOS device separating n-type source and drain features, another silicide layer formed on the n-type source and drain features of the another NMOS device; and another contact etch stop layer (CESL) disposed on the gate spacers of the another NMOS device, wherein the another NMOS device shares a common interconnect structure of the interconnect structures with the NMOS device, wherein the common interconnect structure is disposed on the another silicide layer of the another NMOS device and on the silicide layer of the NMOS device, wherein the common interconnect structure is in contact with the another CESL disposed on the gate spacers of the another NMOS device and in contact with the CESL disposed on the gate spacers of the NMOS device.

12. A method of manufacturing a semiconductor device comprising:

providing a substrate including a first device of a first type, a second device of the first type, a third device of a second type, a region between the first and second devices, and a shallow trench isolation (STI) feature between the second and third devices, the first device including a first gate structure, first gate spacers, and first source and drain features, the second device including a second gate structure, second gate spacers, and second source and drain features, and the third device including a third gate structure, third gate spacers, and third source and drain features;

forming a silicide layer on the first, second, and third source and drain features;

forming a contact etch stop layer (CESL) on the and first, second, and third gate spacers, and on the STI feature between the second and third devices;

forming an interlayer dielectric (ILD) layer on the CESL in the region between the second and third devices;

forming interconnect structures on the silicide layer over the third source and drain features and on vertically extending planar sidewalls of the CESL on the third gate spacers, wherein the vertically extending planar sidewalls of the CESL terminate at a top surface, and wherein the top surface of the CESL and a top surface of the interconnect structures are in a common plane; and forming a common interconnect structure traversing the region between the first and second devices, the common interconnect structure being in electrical contact with the first and second source and drain features, and in contact with the CESL disposed on the first and second gate spacers.

13. The method of claim 12 wherein the gate structure is formed by a gate last process, the gate last process including removing a dummy gate and forming a metal gate.

14. The method of claim 12 wherein the gate structure is formed by a gate first process.

15. The method of claim 12 wherein the first and second devices are a N-type metal-oxide-semiconductor (NMOS) FET device, and wherein the third device is a P-type metal-oxide-semiconductor (PMOS) FET device.

16. The method of claim 12 wherein the first and second devices are NMOS FET devices.

17. The method of claim 12 wherein the first and second devices are PMOS FET devices.

* * * * *